United States Patent [19]

Peterson et al.

[11] 4,449,373

[45] May 22, 1984

[54] REDUCED VACUUM CRYOPUMP

[75] Inventors: John F. Peterson, Lynnfield; Allen J. Bartlett, Milford, both of Mass.

[73] Assignee: Helix Technology Corporation, Waltham, Mass.

[21] Appl. No.: 470,914

[22] Filed: Feb. 28, 1983

[51] Int. Cl.³ .............................................. B01D 8/00
[52] U.S. Cl. ..................................... 62/55.5; 55/269; 62/100; 62/268; 417/901
[58] Field of Search ....................... 62/55.5, 100, 268; 417/901; 55/269

[56] References Cited

U.S. PATENT DOCUMENTS 4,148,196  4/1979  French et al.
4,285,710  8/1981  Welch
4,339,927  7/1982  Sarcia

OTHER PUBLICATIONS

"Update on Cryogenic Pumps", *Semiconductor International*, Oct., 1982, pp. 89-99.
Advertisement from Airco Temescal, a division of Airco Inc., 2850 Seventh St., Berkeley, CA 94710 (5 pages).

*Primary Examiner*—Ronald C. Capossela
*Attorney, Agent, or Firm*—Hamilton, Brook, Smith & Reynolds

[57] ABSTRACT

A cryopump 20 for differentially pumping water vapor and inert gases from a work space comprising a two stage refrigerator 45 in which a radiation shield 32 substantially encloses a second stage cryopanel 40. The radiation shield 32 incorporates a baffle plate 34 which condenses higher condensing temperature gases and restricts passage of low condensing temperature gases through orifices 36 to the second stage cryopanel 40. Backside pumping ports 38 provide a flow path to the second stage refrigerator for residual gases within the cryopump 20. This creates a high vacuum within the cryopump and allows it to operate at maximum efficiency.

8 Claims, 3 Drawing Figures

4,449,373

REDUCED VACUUM CRYOPUMP

DESCRIPTION

1. Technical Field

This invention relates to cryopumps and has particular application to cryopumps used in sputtering operations.

2. Background

Cryopumps are frequently used to remove air from work spaces and hold them at a high vacuum. Cryopumps operate most effectively at high vacuums that minimize heat and conductive losses. Further, gas contaminants are best removed from the environment at low temperatures and pressures. Many processes require such high vacuum environments in the work space for good process results. Nevertheless, some processes require intermediate vacuums.

Cryopumps create high vacuum environments by condensing the atmospheric gases on cold temperature arrays. Very low boiling point gases are adsorbed from the work space environment while higher vaporization temperature gases freeze on the surfaces of the cryopump. During operations in the work space, periodic bursts of gas are injected into that space. The cryopump removes those gases very quickly to produce a very high vacuum state. The cryopump continues to remove gas until the time is reached when the cryopump is no longer capable of either adsorbing or condensing gases because it has been filled with gas previously removed from the environment. At such times cryopumps must be regenerated. Regeneration is accomplished by allowing the cryopump to return to a higher temperature so condensed gases may sublimate and be released.

For many operations the extremely low pressures provided by the cryopump actually inhibit operations. In particular, sputtering is a method of applying a coating to the surface of a workpiece. For best results pressures of inert gases in the range of $1 \times 10^{-4}$ torr to $5 \times 10^{-2}$ torr are required. Conventional cryopumps operate most efficiently at pressures below $1 \times 10^{-5}$ torr.

In conventional systems utilizing cryopumps to create proper conditions for sputtering, inert gases such as argon are injected into the work space during the sputtering operation to raise the work space pressure and provide an inert gas environment. The specific pressure desired is obtained by a balance of argon introduced into the work chamber and argon condensed by the cryopump. It is evident that cryopump regeneration need occur more often if large amounts of inert gas are injected into the environment during operations. Because of the injection of inert gases, the cryopump's surfaces quickly become overloaded and environment pressure increases beyond that which allows sputtering to occur.

In some conventional systems a throttle valve has been positioned between the cryopump and the work space. The throttle valve serves to create a pressure differential between the work space and the cryopump by restricting the gas flow between the two. Throttle valves, however, have not been completely successful.

Throttle valves held at ambient temperatures generally restrict all gases from contact with the cryopump. It is therefore possible that water vapor which inhibits sputtering and can prevent proper bonding of the deposited coating to the workpiece will remain in the work space.

Some variable throttle valves are cooled in order to condense water vapor from the work space while throttling the remaining gases. Unfortunately, variable throttle valves which are cooled frequently freeze in the very low pressure environment of the cryopump and prevent any gases from reaching the cryopump. Water ice and carbon dioxide ice forming on valves prevent their adjustment and control of the gas passage between the work space and the cryopump. Such cold variable throttle valves have therefore been found to be difficult to operate and inefficient in maintaining inert gas environments.

A need therefore exists for a cryopump capable of efficient operation for long periods of time at work chamber pressures higher than that at which cryopumps have previously been able to efficiently operate.

SUMMARY OF THE INVENTION

This invention comprises a cryopump for differentially pumping water vapor and inert gases from a work chamber. The cryopump comprises a cryopump housing incorporating a pumping port for attachment to the work chamber, and a refrigerator within the cryopump housing having a first and second axial stage. A second stage cryopanel is mounted directly to a low temperature heat sink on the second stage and is surrounded by a radiation shield which is in contact with a higher temperature heat sink on the first stage.

A frontal inlet orifice plate is positioned across the pumping port and is in thermal communication with the radiation shield. The orifice plate acts as part of the radiation shield and serves to restrict flow of lower condensing temperature gas from the work chamber to the second stage cryopanel. This allows for a moderate pressure of low condensing temperature gas to be maintained in the work chamber while high condensing temperature gases condense on the baffle plate.

A gas flow path has been provided through the radiation shield at a position removed from the work chamber such that the radiation shield is surrounded by a vacuum at a lower pressure than the work chamber. In the preferred embodiment, this flow path comprises several small ports in the base of the radiation shield disposed opposite the baffle plate which draw up residual low condensing temperature gas from the interior of the cryopump. This serves to reduce heat transfer between the housing and the radiation shield and thereby increases the efficiency of the cryopump.

In the preferred embodiment, the radiation shield is in close proximity to a cryopump housing in order to form a flow restriction that prevents gas flow between the radiation shield pumping port area and the base of the radiation shield. Alternatively, a positive seal may be placed between the radiation shield and the cryopump housing to eliminate gas flow between the two areas.

A further aspect of the preferred embodiment is the positioning of baffles adjacent to the small pumping ports at the base of the radiation shield which prevent direct heat radiation from reaching the second stage array.

In a preferred embodiment, the orifice plate has several holes which allow restricted passage of low condensing temperature gases from the work chamber to the second stage cryopump. Since the orifice plate has a temperature approaching that of the radiation shield higher condensation point gases condense on the orifice plate itself. The holes in the orifice plate are best sized at about one-half inch diameter. Although the hole size may range between ¼ inch to about ¾ inch, it has been found that at ½ inch the holes restrict the passage of low condensation point gases while not being susceptible to closure due to ice forming on the baffle plate itself.

BRIEF DESCRIPTION OF THE DRAWINGS

The foregoing and other objects, features, and advantages of the invention will be apparent in the following more particular description of the preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1A is a partial cross section of the cryopump showing an optional radiation shield seal.

DETAILED DESCRIPTION OF THE INVENTION

Figure 1:
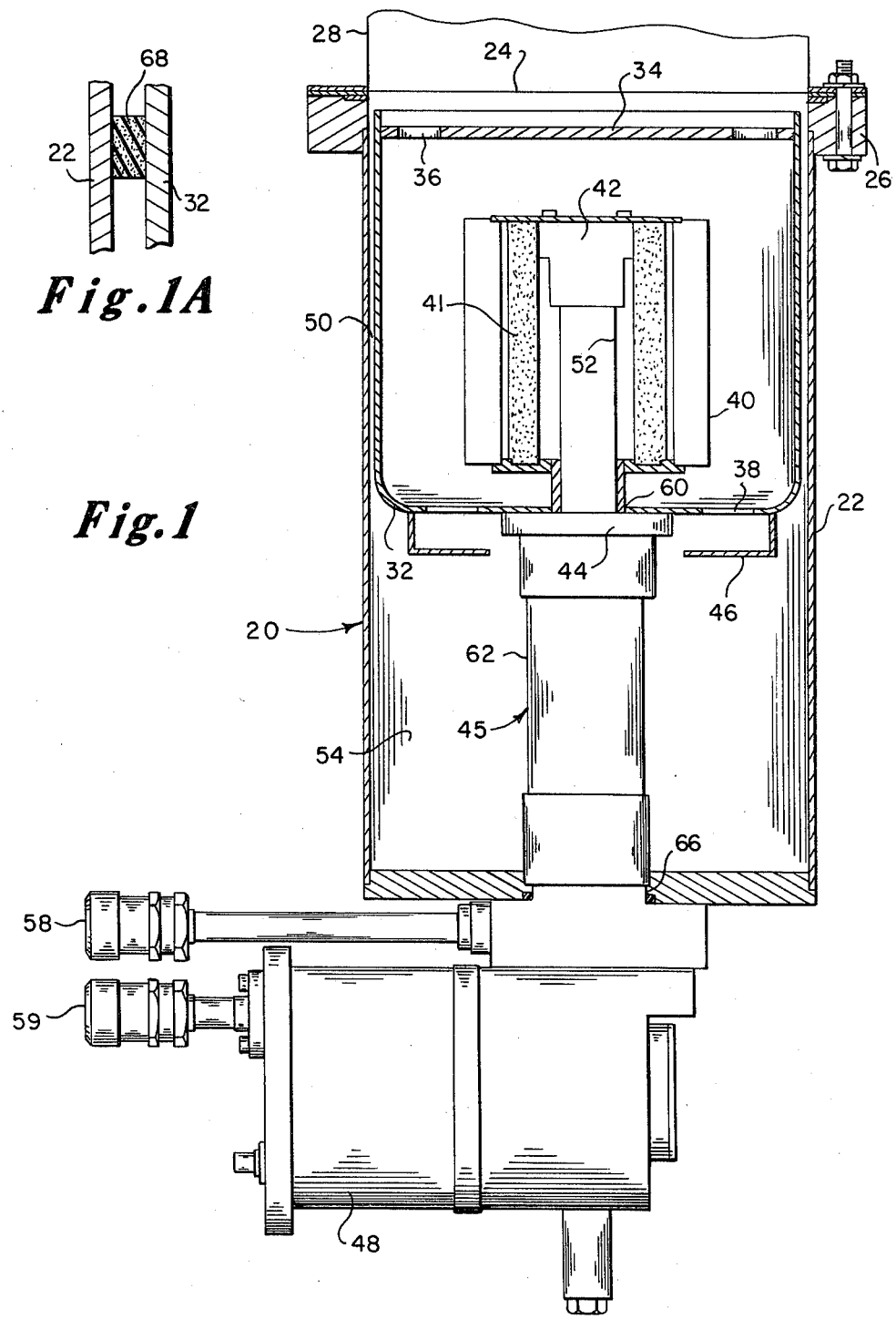
FIG. 1 is an elevational cross section of a cryopump embodying the invention.

FIG. 1 is a cross sectional view of a cryopump incorporating the principles of this invention which enable it to efficiently maintain a moderate vacuum in a work chamber. The cryopump provides maximum water vapor pumping speed while limiting pumping speed for inert gases.

The cryopump 20 in FIG. 1 comprises a main cryopump housing 22 which may be mounted either directly to a work chamber along flange 26 or to an intermediate gate valve between it and the work chamber. The cryopump in this view is bolted to conduit 28 which connects it to the work chamber. A two-stage cold finger 45 of the refrigerator protrudes into the cryopump housing through an opening 66. In this case the refrigerator is a Gifford-MacMahon refrigerator, but others may be used.

A two-stage displacer is arranged within the cold finger 45 and driven by the motor 48. With each cycle helium gas is introduced through input line 59 into the cold finger under pressure and is expanded and thus cooled. It is then exhausted through line 58 to a compressor. Such a refrigerator is disclosed in U.S. Pat. No. 3,218,815 to Chellis et al.

A first stage pumping surface 34 is mounted to the cold end heat sink 44 of the first stage refrigerator 62 through a radiation shield 32. Similarly, a second stage pumping array 40 is mounted to the cold end heat sink 42 of the second stage 52. The second stage 52 of the cold finger extends through an opening 60 at the base of a radiation shield 32.

The second stage pumping surface discussed herein comprises a set of vertical chevrons 40 arranged in an annular array, however, other configurations of the second stage pumping surface having adsorbent material would be acceptable for use with this invention. This chevron array, mounted to heat sink 42, operates at a temperature of about 15° K. Enclosed within the annular array of chevrons 40 is an array of panels 41 that hold an adsorbent for low temperature gases. Access to this adsorbent array 41 by extremely low boiling point gases such as hydrogen results in their adsorption and removal from the environment.

The cup shaped radiation shield 32, mounted to the first stage heat sink 44, operates at about 77° K. The radiation shield 32 surrounds the second stage cryopumping area and minimizes the heating of that area by direct radiation and higher boiling point vapors. The first stage also comprises a front baffle plate 34, which serves as both a radiation shield for the second stage pumping area and as a cryopumping surface for higher boiling temperature gases such as water vapor. The baffle plate 34 has ten orifice holes 36 which restrict flow of lower boiling temperature gases such as argon to the second stage pumping area.

The orifice plate 34 acts in a selective manner because it is held at a temperature approaching that of the first stage heat sink (between 77° and 130° K.), and is therefore an integral part of the cryopump. The orifice plate 34 therefore acts primarily as an orifice only to the lower condensing temperature gases remaining. While the higher condensing temperature gases freeze on the baffle plate itself, the orifices 36 restrict passage of these lower condensing temperature gases to the second stage. By restricting flow to the inner second stage pumping area, a percentage of inert gases, primarily argon, is allowed to remain in the working space to provide a moderate pressure of inert gas for optimal sputtering. To summarize, of the gases arriving at the cryopump port 24, higher condensing temperature gases are removed from the environment while the flow of lower temperature gases to the second stage pumping surface is restricted. The flow restriction results in a higher pressure in the working chamber.

Figure 2:
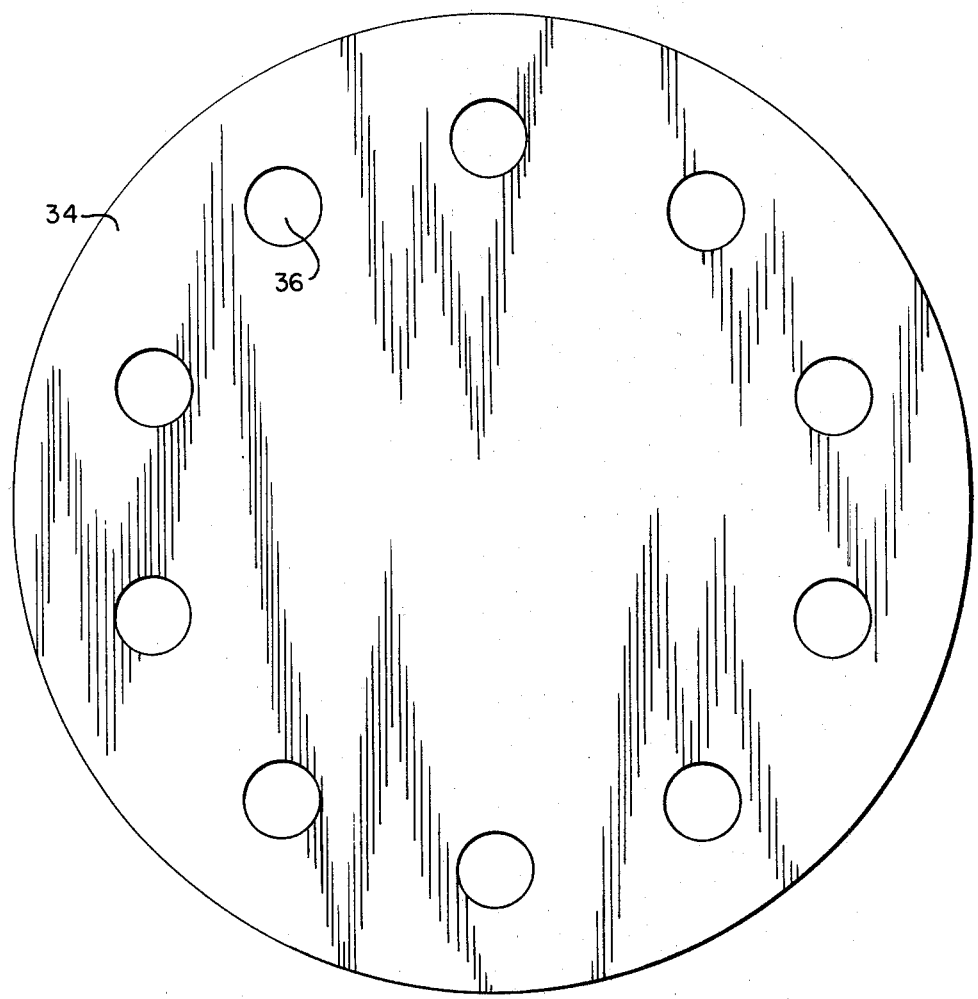
FIG. 2 is a plan view of the cryopump's integral cold orifice.

FIG. 2 is a plan view of the orifice plate section of the radiation shield. The number of orifice holes 36 and their size determine the pressure maintained in the work space for sputtering operations. Many small holes provide for even distribution of the restricted gas flow through the plate 34. On the other hand, each orifice 36 must be of sufficient size so that ice forming on the baffle plate does not completely close the orifice to lower temperature condensing gases. Ice buildup could prevent entry of lower temperature gases into the second stage pumping area and result in a pressure buildup in the work space. An optimum hole size has been found to be in the range of 0.25 inch to 0.75 inch.

For a given hole size, the degree of flow restriction is determined by the number of holes. The number of holes is therefore varied according to the size of the working space to be evacuated and the desired pressure. For a typical working space used in sputtering ten holes sized of approximately ½ inch diameter have been used.

A major problem which this invention addresses is the need to retain a low vacuum in the cryopump housing so as to maintain high cryopump efficiency. It is critical that a high vacuum be maintained in the annulus 50 between the radiation shield 32 and the housing 22. If the moderate vacuum of the working space is allowed to exist in that annulus, heat transfer from the housing to the radiation shield results in excessive energy loss and pump inefficiency. This problem has been solved through the use of a pressure gradient established within the cryopump housing by the radiation shield 32 and the differential pumping ports 38.

Differential pumping ports 38 allow direct pumping from the rear plenum 54 to reduce the pressure therein. Gases not condensed on the radiation shield are drawn through ports 38 into the second stage pumping area 40 and are there condensed or adsorbed. Baffles 46 are positioned over the differential ports 38 in order to prevent heating of the second stage array by radiation from the cryopump housing 22.

The very low pressure produced in the plenum serves to also hold annulus 50 at a low pressure. At this very low pressure, heat transfer between the cryopump housing and the radiation shield 32 is greatly reduced because conductive and convective heat transfer is substantially eliminated. The narrowness of the annulus 50 between the radiation shield 32 and the housing 22 serves to restrict passage of gas to the rear plenum of the cryopump 54 from the cryopump port 24 and this produces a sharp pressure drop from the work chamber pressure at the upper inlet to the annulus. The gap 50 best controls gas passage if it is maintained at less than 3/16 of an inch. The combination of the rear pumping ports and the small annulus 50 enables the cryopump to operate with a very high vacuum about the second stage and radiation shield to provide maximum efficiency. Alternatively, optional seal 68 (FIG. 1A) may be added to further restrict fluid communication between the work chamber and the radiation shield.

With the cold orifice plate presented herein, the cryopump acts to remove higher condensing temperature gases from the environment while allowing lower condensing temperature gases to be easily maintained in the work space. A low pressure of inert gases provides the optimum environment for sputtering. Successful incorporation of the orifice into the radiation shield of the cryopump results from the differential pumping ports 38 which allow the greater part of the internal workings of the cryopump to operate at low pressures. By allowing the helium refrigerator 45, the cryopumping surfaces and the radiation shield to operate in a low pressure environment, heat conductance to the shield and arrays is substantially eliminated and the cryopump operates most efficiently. Further, the adsorbent panels 41 which operate best at very low pressures are thereby made more efficient.

In sputtering operations utilizing this cryopump, injection of inert gases such as argon into the work space is still needed to maintain intermediate pressures, and the rate of injection can be varied to control that pressure. However, a much lower rate of gas injection is required to maintain optimal sputtering pressures than has been previously required with conventional cryopumps which have no throttle valve. Contaminant gases, such as hydrogen, are efficiently removed from the environment since the conductance of the orifice is four times higher for hydrogen than argon due to hydrogens's low molecular weight. Further, the adsorbent array 41 operates efficiently at the low pressure and temperature maintained within the second stage. Because of this, a cryopump incorporating this invention promotes the creation of a moderate pressure, inert gas environment.

In conventional sputtering systems utilizing cryopumps without throttle valves, cryopump regeneration is generally required at least once a day. In systems using the cryopump described herein, regeneration may not be required for several days. This is important because cryopump regeneration requires the shutdown of manufacturing for a period of time to allow the cryopump to warm and release condensed gas. Each time regeneration is required, shop time and wages are lost which makes the final workpiece more expensive to produce. In providing a novel cryopump design requiring less regeneration, sputtering may now be done more inexpensively than before.

When a relatively warm valve or orifice plate is positioned between the cryopump and the work space as has been done previously, the valve restricts access of all gases to the cryopump and does not produce a moderate vacuum, inert gas environment. If water vapor and other high temperature gases are allowed to remain in the environment, sputtering quality declines because adhesion of the sputtered particles to the work pieces is poor.

This invention also avoids the use of variable throttle valves which are subject to freezing and are difficult to adjust properly. During sputtering operations the work environment is fully controllable by variation of the argon input, thus there is no need to vary the throttle valve. Further, the differential pumping ports 38 keep the pump operating at high efficiency and thereby avoid the inefficiencies associated with previous throttle valves.

While the invention has been particularly shown and described with reference to preferred embodiments thereof, it will be understood by those skilled in the art that various changes in form and details may be made without departing from the spirit and scope of the invention as defined by the appended claims. For example, the orifice plate may be varied as to the size, number and positions of the orifice holes 36 to optimize the cryopump for the particular work space in use and for the vacuum pressure required without changing the novel aspects of this invention.

We claim:

1. A cryopump for differentially pumping water vapor and inert gases comprising:
   a. a cryopump housing incorporating a pumping port for attachment to a work chamber;
   b. a refrigerator within said housing having first and second stages;
   c. a second stage cryopanel mounted directly to a low temperature heat sink on the second stage;
   d. a radiation shield partially enclosing the second stage cryopanel, and in thermal contact with a higher temperature heat sink on the first stage;
   e. a frontal inlet orifice plate extending across the pumping port and in thermal communication with the radiation shield, so as to act as part of the radiation shield, the orifice plate restricting flow of low condensing temperature gas from the work chamber to the second stage cryopanel in order to allow a moderate pressure of low condensing temperature gas in the work chamber while condensing higher condensing temperature gases; and
   f. a gas flow path provided through the radiation shield at a position removed from the pumping port such that the radiation shield is surrounded by a vacuum at a lower pressure than the work chamber.

2. The cryopump of claim 1 further comprising a small port in the base of the radiation shield, for increasing vacuum in the cryopump housing in areas removed from the pumping port and thereby reducing heat transfer between the housing and the radiation shield.

3. The cryopump of claim 2 further comprising a baffle adjacent to the small port in the radiation shield to prevent heating of the second stage array from the cryopump housing.

4. The cryopump of claim 1 further comprising a seal positioned between the radiation shield and the cryopump housing.

5. A cryopump for reduced vacuum work chambers comprising:
   a. a refrigerator housing incorporating a pumping port for attachment to a work chamber;
   b. a refrigerator within said housing having first and second axial stages;
   c. a second stage cryopanel mounted directly to a low temperature heat sink on the second stage;
   d. a radiation shield partially enclosing the second stage cryopanel, and in thermal contact with a higher temperature heat sink on the first stage;
   e. a frontal orifice plate extending across the pumping port and in thermal communication with the radiation shield, so as to act as part of the radiation shield;
   f. several orifice holes of 0.25 to 0.75 inch diameter in said orifice plate to allow for restricted passage of low temperature boiling point gases to the second stage cryopanel while encouraging condensation of higher boiling point gases about the plate; and
   g. several small ports in the radiation shield for reducing pressure in the cryopump housing in areas removed from the pumping port in order to reduce heat transfer between the housing and the radiation shield.

6. A high pressure cryopump that provides maximum water vapor pumping speed while limiting inert gas pumping speed comprising:
   a. a cryopump housing incorporating a pumping port for attachment to a work chamber;
   b. a refrigerator within said housing having a first and second axial stage;
   c. a second stage cryopanel mounted directly to a low temperature heat sink on the second stage;
   d. a radiation shield enclosing the second stage cryopanel in thermal contact with a higher temperature heat sink on the first stage, part of the radiation shield's outer surface being held less than 3/16 of an inch from the inner surface of the housing so as to form a small passage between the two components that restricts gas flow;
   e. a frontal throttle plate extending across the pumping port and incorporated into the radiation shield, in thermal communication with the first stage heat sink; and
   f. backside ports located in the radiation shield provided to remove gases from the large internal volume of the cryopump without substantially affecting the working space.

7. A method of establishing a moderate pressure of inert gas in a work chamber with a cryopump comprising the steps of:
   a. introducing an inert low condensing temperature gas into the work chamber;
   b. selectively removing higher condensing temperature gases from a work environment through the use of a cold orifice incorporated into a cryopump radiation shield;
   c. shielding lowest temperature cryopump components from direct thermal contact with the moderate vacuum inert gas environment; and
   d. evacuating a volume about the cryopump to a higher vacuum than the work environment so as to minimize heat transfer between cryopump components through the use of a secondary differential pumping port positioned in said radiation shield.

8. A method of establishing a moderate pressure of inert gas in a work chamber as recited in claim 7 further comprising the step of controlling the flow of inert gas into the work chamber in order to vary the work environment.

* * * * *